(12) United States Patent
Zhao et al.

(10) Patent No.: US 12,484,430 B2
(45) Date of Patent: Nov. 25, 2025

(54) DISPLAY PANEL WITH ELECTRODE SURROUNDING PIXEL ELECTRODE

(71) Applicant: SHENZHEN CHINA STAR OPTOELECTRONICS SEMICONDUCTOR DISPLAY TECHNOLOGY CO., LTD., Guangdong (CN)

(72) Inventors: Jinyang Zhao, Guangdong (CN); Lixuan Chen, Guangdong (CN); Zhiqing Shi, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/600,112

(22) PCT Filed: Aug. 30, 2021

(86) PCT No.: PCT/CN2021/115370
§ 371 (c)(1),
(2) Date: Sep. 30, 2021

(87) PCT Pub. No.: WO2023/019634
PCT Pub. Date: Feb. 23, 2023

(65) Prior Publication Data
US 2024/0057461 A1 Feb. 15, 2024

(30) Foreign Application Priority Data

Aug. 18, 2021 (CN) .......................... 202110947907.9

(51) Int. Cl.
*H10K 71/13* (2023.01)
*H10K 59/124* (2023.01)
(Continued)

(52) U.S. Cl.
CPC ......... *H10K 71/135* (2023.02); *H10K 59/124* (2023.02); *H10K 59/131* (2023.02);
(Continued)

(58) Field of Classification Search
CPC .. H10K 71/135; H10K 71/811; H10K 59/131; H10K 59/124; H10K 59/80522; H10K 59/126; H10K 2102/341
See application file for complete search history.

(56) References Cited

U.S. PATENT DOCUMENTS

2002/0158835 A1* 10/2002 Kobayashi ....... H10K 59/80522
345/100
2019/0081115 A1* 3/2019 Cheng .................. H10K 50/805
(Continued)

FOREIGN PATENT DOCUMENTS

| CN | 106953030 | 7/2017 |
| CN | 107331788 | 11/2017 |

(Continued)

OTHER PUBLICATIONS

International Search Report and the Written Opinion Dated Apr. 25, 2022 From the International Searching Authority Re. Application No. PCT/CN2021/115370 and Its Translation Into English. (14 Pages).
(Continued)

*Primary Examiner* — Lex H Malsawma

(57) ABSTRACT

An embodiment of the present application provides a display panel. The display panel generates an electric field on the pixel electrode. In the display panel provided by the present application, since opposite poles that generate the electric field are specially designed, a distance between the opposite poles that generate the electric field is constant everywhere, thereby improving uniformity of the electric field. Such electric field assisted deposition of a light-emitting func-
(Continued)

tional layer material and drying of the light-emitting functional layer can suppress a coffee ring effect.

12 Claims, 5 Drawing Sheets

(51) Int. Cl.
*H10K 59/131* (2023.01)
*H10K 59/80* (2023.01)
*H10K 59/126* (2023.01)
*H10K 71/00* (2023.01)
*H10K 102/00* (2023.01)

(52) U.S. Cl.
CPC ..... *H10K 59/80522* (2023.02); *H10K 59/126* (2023.02); *H10K 71/811* (2023.02); *H10K 2102/341* (2023.02)

(56) References Cited

U.S. PATENT DOCUMENTS

2019/0198591 A1* 6/2019 Dai ................. H10K 71/135
2021/0183977 A1* 6/2021 Xiao ................ H01L 28/60

FOREIGN PATENT DOCUMENTS

| | | |
|---|---|---|
| CN | 108428720 | 8/2018 |
| CN | 109411603 | 3/2019 |
| CN | 113345940 | 9/2021 |
| JP | 2002-318556 | 10/2002 |

OTHER PUBLICATIONS

Notice of Reasons for Refusal Dated Oct. 17, 2023 From the Japan Patent Office Re. Application No. 2021-553032 and Its Translation Into English. (6 Pages).

Notification of Office Action and Search Report Dated Nov. 2, 2021 From the State Intellectual Property Office of the People's Republic of China Re. Application No. 202110947907.9 and Its Translation Into English. (18 Pages).

Notification of Office Action and Search Report Dated Sep. 23, 2021 From the State Intellectual Property Office of the People's Republic of China Re. Application No. 202110947907.9 and Its Translation Into English. (15 Pages).

* cited by examiner

DISPLAY PANEL WITH ELECTRODE SURROUNDING PIXEL ELECTRODE

RELATED APPLICATIONS

This application is a National Phase of PCT Patent Application No. PCT/CN2021/115370 having International filing date of Aug. 30, 2021, which claims the benefit of priority of Chinese Patent Application No. 202110947907.9 filed on Aug. 18, 2021. The contents of the above applications are all incorporated by reference as if fully set forth herein in their entirety.

FIELD AND BACKGROUND OF THE INVENTION

Organic light-emitting diode (OLED) displays prepared by inkjet printing technology have been commercialized on a small scale in a field of medium-sized OLEDs. However, inkjet printing has fundamental problems: first, due to a capillary phenomenon of an ink, a pixel definition layer needs to be hydrophobic to reduce a problem of overly thick pixel edge film caused by edge climbing; second, the ink needs to have a high boiling point to prevent volatilization of a solution on a pixel and a nozzle during a printing process, which may cause uneven deposition or nozzle clogging.

During research and practice of the prior art, inventors of the present application found that charged groups in a light-emitting functional layer in the inkjet printing and vacuum drying process easily produce coffee ring phenomenon when a solvent evaporates, which impacts a quality of the light-emitting functional layer.

SUMMARY OF THE INVENTION

An embodiment of the present application provides a display panel, wherein a structure of the display panel can generate an electric field, and the electric field is used to assist inkjet printing and vacuum drying to suppress generation of coffee rings.

An embodiment of the present application provides a display panel, including:
an array substrate,
a pixel electrode layer disposed on the array substrate and including a plurality of pixel electrodes;
an electric field electrode layer disposed on the array substrate, wherein the electric field electrode layer is insulated from the pixel electrode layer, and the electric field electrode layer includes at least one electric field electrode at least surrounding a part of the pixel electrode.

Optionally, in some embodiments of the present application, a gap is defined between the electric field electrode and the pixel electrode, and the gap has a constant distance between a portion of the electric field electrode surrounding the pixel electrode and the pixel electrode.

Optionally, in some embodiments of the present application, the electric field electrode is in one-to-one correspondence to the pixel electrode, and the electric field electrode is arranged around the pixel electrode to form a closed pattern.

Optionally, in some embodiments of the present application, the pixel electrode is arranged in a plurality of rows along a first direction, the pixel electrode is arranged in a plurality of columns along a second direction, and the electric field electrode includes a first part and a second part, wherein the first part is arranged between adjacent ones of the rows of the pixel electrode along the first direction, the second part is arranged between adjacent ones of the rows of the pixel electrode along the second direction, the first part is connected to the second part, and the first direction intersects the second direction.

Optionally, in some embodiments of the present application, the pixel electrode is arranged in multiple rows along a first direction, the pixel electrode is arranged in multiple columns along a second direction, and the electric field electrode is arranged between adjacent ones of the columns of the pixel electrode along the first direction, or between adjacent ones of the rows of the pixel electrode along the second direction, and the first direction intersects the second direction.

Optionally, in some embodiments of the present application, a distance of the gap is between 1 μm and 10 μm.

Optionally, in some embodiments of the present application, a distance of the gap is between 2 μm and 5 μm.

Optionally, in some embodiments of the present application, the array substrate further includes a thin film transistor, the display panel further includes a planarization layer, and the pixel electrode layer is disposed on the planarization layer and connected to the thin film transistor.

Optionally, in some embodiments of the present application, the thin film transistor includes a semiconductor layer, a gate insulating layer, a gate layer, an interlayer insulating layer, a drain wiring, and a source wiring which are stacked, the electric field electrode layer is a signal wiring layer, and the electric field electrode layer is disposed in a same layer as the gate layer, or the electric field electrode layer is disposed in a same layer as the source wiring and the drain wiring.

Optionally, in some embodiments of the present application, the electric field electrode layer is an auxiliary electrode layer, and the electric field electrode layer is disposed in a same layer as the pixel electrode layer.

Optionally, in some embodiments of the present application, the display panel further includes a pixel definition layer disposed on a side of the pixel electrode layer away from the array substrate, the pixel definition layer is provided with an opening thereon, and the opening is defined corresponding to the pixel electrode.

Optionally, in some embodiments of the present application, a side of the pixel definition layer close to the array substrate is hydrophilic, and a side of the pixel definition layer away from the array substrate is hydrophobic.

Optionally, in some embodiments of the present application, the array substrate includes a light shielding layer, a first capacitor plate, a buffer layer, a semiconductor layer, a second capacitor plate, and a gate insulating layer, a gate layer, an interlayer insulating layer, a drain wiring, a source wiring, an auxiliary cathode wiring, a passivation layer, and a planarization layer which are sequentially stacked on a side of the substrate; and the pixel electrode layer and the electric field electrode layer are disposed on the planarization layer.

Optionally, in some embodiments of the present application, a material of the electric field electrode layer is one or a combination of gold, silver, copper, aluminum, and transparent metal oxide.

An embodiment of the present application also provides a display panel, including:
an array substrate; and
a pixel electrode layer disposed on the array substrate, and including a plurality of pixel electrodes, wherein each of the pixel electrodes has a first electrode portion and a second electrode portion, and the first electrode portion is disposed around at least a part of the second electrode portion.

Optionally, in some embodiments of the present application, a gap is defined between the first electrode portion and the second electrode portion, and the gap has a constant distance between a portion of the first electrode portion surrounding the second electrode portion and the second electrode portion.

Optionally, in some embodiments of the present application, the array substrate further includes a thin film transistor, the display panel further includes a planarization layer, and the pixel electrode layer is disposed on the planarization layer and connected to the thin film transistor; and wherein each of the thin film transistor correspondingly controls a voltage of the first electrode portion or the second electrode portion.

Optionally, in some embodiments of the present application, the pixel electrode includes m rows×n columns of sub-pixel electrodes, and a gap is defined between adjacent ones of the sub-pixel electrodes, and the sub-pixel electrodes include a plurality of first sub-pixel electrodes and at least one second sub-pixel electrode, and the first sub-pixel electrodes are arranged around at least a part of the second sub-pixel electrode; wherein m and n are positive integers greater than or equal to 3.

Optionally, in some embodiments of the present application, the display panel further includes a thin film transistor and a planarization layer, and the pixel electrode layer is disposed on the planarization layer and connected to the thin film transistor; and wherein each of the thin film transistor correspondingly controls a voltage of one row of the sub-pixel electrodes, or each of the thin film transistor correspondingly controls a voltage of one column of the sub-pixel electrodes.

Optionally, in some embodiments of the present application, the display panel further includes a thin film transistor and a planarization layer, and the pixel electrode layer is disposed on the planarization layer and connected to the thin film transistor; and wherein each of the thin film transistor correspondingly controls a voltage of one of the sub-pixel electrodes.

An embodiment of the present application provides a display panel. The display panel can generate an electric field on a pixel electrode by controlling a voltage difference between a pixel electrode layer and the electric field electrode layer, or controlling a voltage difference generated inside the pixel electrode layer. Since opposite poles of the display panel provided in the present application for generating the electric field are specially designed, a distance between the opposite poles that generate the electric field is constant everywhere. That is, shapes of the opposite poles that generate the electric field are matched with each other, thereby improving uniformity of the electric field. A vertical component of the electric field provides charged groups in a material of a light-emitting functional layer with a force to deposit on the pixel electrode layer, which can promote deposition of an ink of a light-emitting functional material on the pixel electrode layer during inkjet printing. Material deposition of light-emitting functional layer assisted by the electric field can suppress the generation of coffee rings, and effectively improve a quality of the light-emitting functional layer, thereby improving performance of the display panel.

BRIEF DESCRIPTION OF THE SEVERAL VIEW OF THE DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

Figure 1:
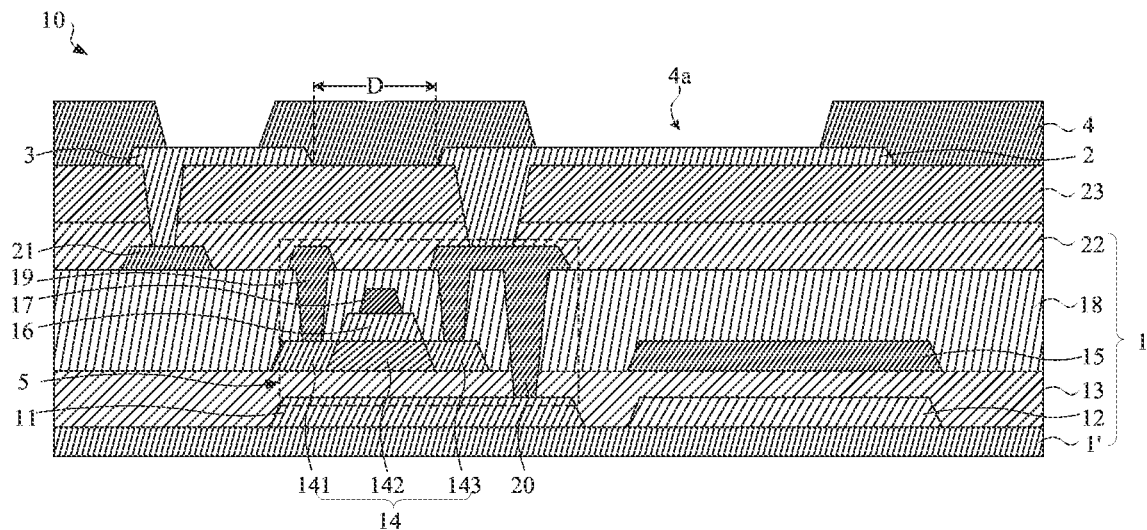
FIG. 1 is a schematic diagram of a first structure of a display panel provided by an embodiment of the present application.

In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

An embodiment of the present application provides a display panel. Embodiments of the present application provide a substrate and a display panel, which will be described in detail below. It should be noted that the order of description in the following embodiments is not intended to limit the preferred order of the embodiments.

Figure 2:
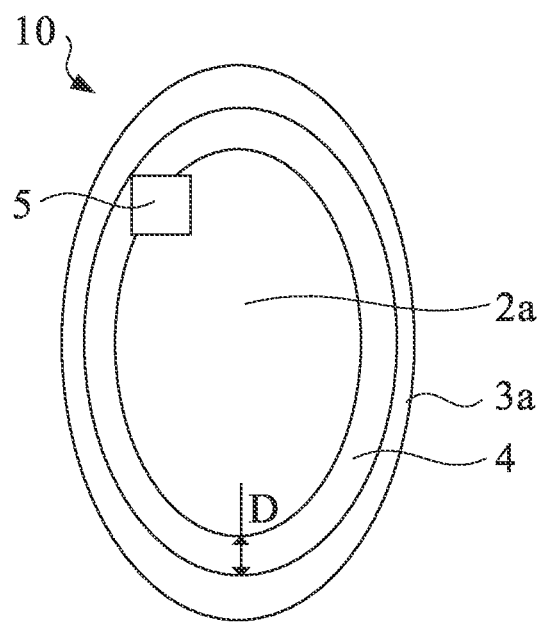
FIG. 2 is a schematic top view of a first structure of the display panel provided by an embodiment of the present application.

Referring to FIG. 1 to FIG. 2. FIG. 1 is a schematic diagram of a first structure of a display panel provided by an embodiment of the present application. FIG. 2 is a schematic top view of a first structure of a display panel provided by an embodiment of the present application. The display panel 10 provided in the present application includes an array substrate 1, a pixel electrode layer 2, and an electric field electrode layer 3. The pixel electrode layer 2 is disposed on the array substrate 1. The electric field electrode layer 3 is disposed on the array substrate 1. The electric field electrode layer 3 and the pixel electrode layer 2 are insulated from each other. The electric field electrode layer 3 includes a plurality of electric field electrodes 3a. Each of the electric field electrodes 3a is disposed around at least a part of the pixel electrode layer 2.

When fabricating a light-emitting functional layer on the pixel electrode layer 2, in order to increase uniformity of the light-emitting functional layer, different voltages can be applied to the pixel electrode layer 2 and the electric field electrode layer 3 to form a voltage difference, so that an electric field is formed between the electric field electrode layers 3. The electric field formed between the pixel electrode layer 2 and the electric field electrode layer 3 has a horizontal component and a vertical component. The vertical component of the electric field provides charged groups in a material of a light-emitting functional layer with a force to deposit on the pixel electrode layer 2, which can promote deposition of an ink of a light-emitting functional material on the pixel electrode layer 2 during inkjet printing. The electric field-assisted inkjet printing and vacuum drying processes can be used to effectively suppress the coffee ring effect of the charged groups in the light-emitting functional layer during deposition and solvent volatilization, thereby improving a film formation quality of nanoparticles.

A gap D is defined between the electric field electrode 3a and the pixel electrode 2a. The gap D has a constant distance between a portion of the electric field electrode 2a surrounding the pixel electrode 2a and the pixel electrode 2a.

In order to better suppress the coffee ring effect and improve the film formation quality of nanoparticles, the uniformity of the electric field during electric field-assisted inkjet printing and vacuum drying is particularly important. In the display panel 10 provided in the present application, the gap D has a constant distance between the electric field electrode layer 3 surrounding the pixel electrode layer 2 and the pixel electrode layer 2, and a more uniform electric field can be formed between the pixel electrode layer 2 and the electric field electrode layer 3. As such, the uniformity of the electric field is improved, and the uniformity of the light-emitting functional layer printed with the assistance of the electric field can also be effectively improved, thereby improving the performance of the light-emitting device.

The array substrate 1 includes a substrate 1'. The substrate 1' refers to a base member configured to support the touch electrode structure. For example, the substrate 1' may be a glass, an organic glass, a functional glass (sensor glass), a hard insulating film material, a soft insulating film material, or a flexible substrate.

The functional glass is obtained by sputtering a transparent metal oxide conductive film coating on an ultra-thin glass followed by a high-temperature annealing treatment. A material used for the flexible substrate is a polymer material. Specifically, the material used for the flexible substrate may be polyimide (PI), polyethylene (PE), polypropylene (PP), polystyrene (PS), polyethylene terephthalate (PET), or polyethylene naphthalate (PEN). The polymer material has good flexibility, light weight and impact resistance, and is suitable for flexible display panels. Among them, polyimide can achieve good heat resistance and stability.

The pixel electrode layer 2 can be formed by a transparent metal oxide or a stack of metal and a transparent metal oxide. The pixel electrode layer 2 may also use a material such as graphene materials, metal materials, and transition metal chalcogenides.

Specifically, the transition metal sulfide includes molybdenum sulfide ($MoS_2$), molybdenum selenide ($MoSe_2$), tungsten sulfide ($WS_2$), or tungsten selenide ($WSe_2$).

A material used for the transparent metal oxide layer includes any one of indium gallium zinc oxide, indium zinc tin oxide, indium gallium zinc tin oxide, indium tin oxide, indium zinc oxide, indium aluminum zinc oxide, indium gallium tin oxide, and antimony tin oxide. The above materials have good conductivity and transparency, and have a small thickness, which will not impact an overall thickness of the display panel. Meanwhile, the above materials can also reduce a harmful electronic radiation and ultraviolet and infrared light that are harmful to a human body. A material used for the metal layer is any one of silver, aluminum, nickel, chromium, molybdenum, copper, tungsten, and titanium.

The metal has good conductivity and low cost, which can reduce a production cost while ensuring a conductivity of an anode.

In one embodiment, the pixel electrode layer 2 is deposited as a stack of indium tin oxide/silver/indium tin oxide. It is appreciated that the pixel electrode layer 2 may be an anode or a cathode of the light-emitting device. In the present application, the pixel electrode layer 2 being an anode is taken as an example for description.

A material used for the electric field electrode layer 3 may be one or a combination of gold, silver, copper, aluminum and transparent metal oxide. Insulating arrangement means that there is a gap between the pixel electrode layer 2 and the electric field electrode layer 3. For example, an inorganic film such as a passivation layer, an interlayer insulating layer, or a buffer layer may be provided between the pixel electrode layer 2 and the electric field electrode layer 3 for insulation. A specific arrangement can be adaptively changed according to the specific display panel 10, which will not be described in details herein for brevity. It should be noted that the pixel electrode layer 2 and the electric field electrode layer 3 described in the present application are arranged on the array substrate 1, which means that the pixel electrode layer 2 and the electric field electrode layer 3 are arranged on the same side of the array substrate 1. The pixel electrode layer 2 and the electric field electrode layer 3 are not limited to abut against a surface of the array substrate 1. In addition, the relative positional relationship between the pixel electrode layer 2 and the electric field electrode layer 3 in the figure is only for illustration, and not as a limitation to the present application.

Optionally, the array substrate 1 further includes a thin film transistor 5. The display panel 10 further includes a planarization layer 23. The pixel electrode layer is disposed on the planarization layer 23 and connected to the thin film transistor 5. Further, the thin film transistor 5 includes a semiconductor layer 14, a gate insulating layer 16, a gate layer 17, an interlayer insulating layer 18, a drain wiring 19, and a source wiring 20.

The array substrate 1 further includes a light shielding layer 11, a first capacitor plate 12, a buffer layer 13, the semiconductor layer 14, the second capacitor plate 15, the gate insulating layer 16, the gate layer 17, the interlayer insulating layer 18, the drain wiring 19, and the source wiring 20, an auxiliary cathode wiring 21, a passivation layer 22, and a planarization layer 23, which are sequentially stacked on one side of the substrate 1'. In an embodiment shown in FIG. 1, the electric field electrode layer 3 is an auxiliary cathode layer, wherein the semiconductor layer 14 includes a drain region 141, an active region 142, and a source region 143. The pixel definition layer 4 is provided with an opening 4a.

FIG. 1 takes the thin film transistor 5 as a top gate structure as an example for illustration. It is appreciated that the present application does not limit a structure of the thin film transistor 5 included in the display panel 10. It can be a top-gate thin film transistor or a bottom-gate thin film transistor, and it can be a double-gate thin film transistor. It may also be a single-gate thin film transistor. A specific structure of the thin film transistor will not be described in detail in the present application.

In the display panel 10 shown in FIG. 1, the electric field electrode layer 3 is an auxiliary electrode layer, and the electric field electrode layer 3 is provided in the same layer as the pixel electrode layer 2. The auxiliary electrode layer can be used as the auxiliary cathode layer to connect to a surface cathode for reducing a voltage drop of the surface cathode. The auxiliary cathode wiring 21 is used to control a potential of the auxiliary cathode layer, that is, the electric field electrode layer 3, so that a voltage difference is formed between the electric field electrode layer 3 and the pixel electrode layer 2, and thereby an electric field is formed between the pixel electrode layer 2 and the electric field electrode layer 3. The auxiliary cathode layer and the pixel electrode 2a are in the same sub-pixel, and a distance between the auxiliary cathode layer and the pixel electrode 2a is very small. The auxiliary cathode layer is used as the electric field electrode layer 3 to form an electric field with the pixel electrode 2a, which can increase an intensity of the formed electric field, so that a greater auxiliary effect of the electric field force can be obtained during inkjet printing.

Optionally, a distance of the gap D is between 1 μm and 10 μm. Further, the distance of the gap D is between 2 μm and 5 μm. Specifically, the distance of the gap D may be 1 μm, 2 μm, 3 μm, 4 μm, 5 μm, 6 μm, 7 μm, 8 μm, 9 μm, or 10 μm. The distance of the gap D is set to be between 1 μm and 10 μm through a comprehensive consideration of an available process accuracy and the intensity of the formed electric field. If the gap D is too wide, a sufficiently strong electric field cannot be formed between the pixel electrode layer 2 and the electric field electrode layer 3. If the gap D is too narrow, an accuracy of a manufacturing process is difficult to achieve, and it is easy to cause a short circuit and impact the operation of the light-emitting device. The distance range of the gap D provided in the present application is an optimal distance of the gap D for generating an electric field between the pixel electrode layer 2 and the electric field electrode layer 3 to assist the deposition of the light-emitting function layer. The distance of the gap D affects the intensity of the electric field, which in turn affects the uniformity of the deposition of the light-emitting functional layer. The distance range of the gap D is adopted to obtain a uniform and suitable electric field, which is obtained after many experiments, and is not a technical means commonly used and easily conceived by those skilled in the art.

Optionally, the display panel 10 further includes a pixel definition layer 4. The pixel defining layer 4 is arranged on the side of the pixel electrode layer 2 away from the array substrate 1. The pixel definition layer 4 is provided with an opening 4a. The opening 4a is provided corresponding to the pixel electrode 2a.

A side of the pixel defining layer 4 close to the array substrate 1 is hydrophilic, and a side of the pixel defining layer 4 away from the array substrate 1 is hydrophobic.

Hydrophilicity means that a surface of a material is easily wetted or solvated by a liquid medium. Liquid repellency (also called liquid repellency) is the opposite of hydrophilicity. Liquid repellency means that the surface of a material is not easily wetted or solvated by a liquid medium. The hydrophilicity and hydrophobicity of the surface of material are mainly determined by a nature of its surface structure or functional groups. In the present application, the hydrophobicity of the pixel definition layer 4 can be changed and adjusted by adjusting the process parameters. For example, the parameters of the development process and the curing process are adjusted. The hydrophobicity of the pixel definition layer 4 is changed and adjusted. The pixel definition layer 4 thus arranged can be adapted to different printing processes, ink types, and film thicknesses, so that the pixel definition layer 4 can more easily adapt to requirements of different display panels.

Specifically, a thickness of the pixel definition layer 4 affects the hydrophobicity of the material. For example, when the hydrophobic material is very thin, it does not exhibit the hydrophobicity. In addition, oxygen ($O_2$) or nitrogen ($N_2$) plasma treatment applied to the material can make the hydrophobicity become hydrophilicity, and a fluorine (F) plasma treatment applied to the material can make the hydrophilicity become hydrophobicity.

Optionally, in the display panel 10 provided by an embodiment of the present application, the electric field electrode 3a may be arranged around a portion of the pixel electrode 2a. For example, when the pixel electrode 2a is circular, the electric field electrode 3a is arranged in a semicircular shape and arranged around half of the pixel electrode 2a. For another example, when the pixel electrode 2a is elliptical, the electric field electrode 3a is in a U-shape and arranged around the pixel electrode 2a.

Optionally, as shown in FIG. 2, the electric field electrode 3a is in one-to-one correspondence to the pixel electrode 2a. The electric field electrode 3a is arranged around the pixel electrode 2a to form a closed pattern.

In this embodiment, the electric field electrode 3a is arranged around the pixel electrode 2a and forms a closed pattern. Since voltages are applied to the electric field electrode 3a and the pixel electrode 2a, respectively when an electric field is formed between the electric field electrode 3a and the pixel electrode 2a, when the electric field electrode 3a forms the closed pattern around the pixel electrode 2a, and the gap D between the electric field electrode 3a and the pixel electrode 2a is constant everywhere, that is, the distance between the two electrodes forming the electric field is the same, the electric field uniformity can be improved.

In addition, the electric field electrode 3a is independently arranged in one-to-one correspondence to the pixel electrode 2a. Such a structure can form an independent electric field on each pixel electrode 2a when an electric field is formed. After the independent electric field is formed, it is more convenient for independent production of pixels of different colors in the light-emitting function layer, and the electric field of each pixel electrode can be independently controlled. As a result, the display panel 10 is more suitable for the production of light-emitting functional layers required for different pixel arrangements.

Figure 3:
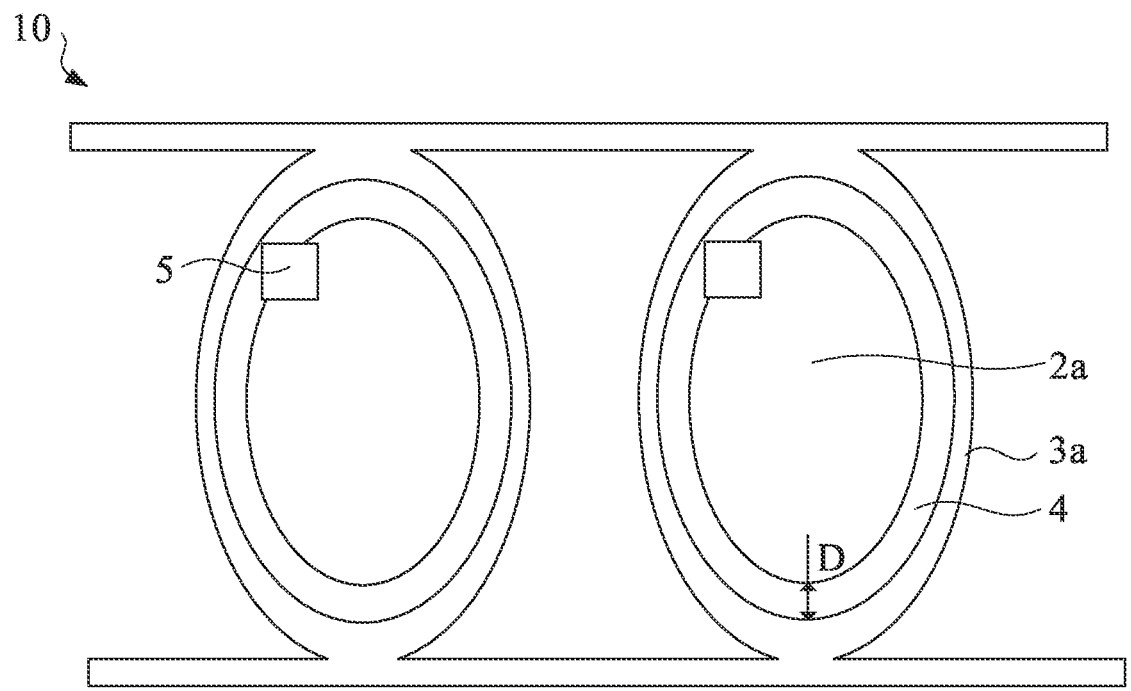
FIG. 3 is a schematic top view of a second structure of the display panel provided by an embodiment of the present application.

It should be noted that, in FIG. 2, the electric field electrode 3a in one-to-one correspondence to the pixel electrode 2a is taken as example for description. In some embodiments, the electric field electrode layer 3 includes a continuous pattern to form a plurality of electric field electrodes 3a. Referring to FIG. 3, FIG. 3 is a schematic top view of a second structure of the display panel provided by an embodiment of the present application. The electric field electrode 3a surrounding the pixel electrodes 2a are arranged in a continuous pattern, and a voltage can be simultaneously applied to a plurality of electric field electrodes 3a in the electric field electrode layer 3. For example, a voltage is simultaneously applied to the electric field electrodes 3a in a same row, and then voltages of the pixel electrodes 2a corresponding to the row are controlled to form an electric field in the row. As a result, when the pixels in the same row have the light-emitting functional layer of a same color, production efficiency of the light-emitting functional layer can be improved.

Figure 4:
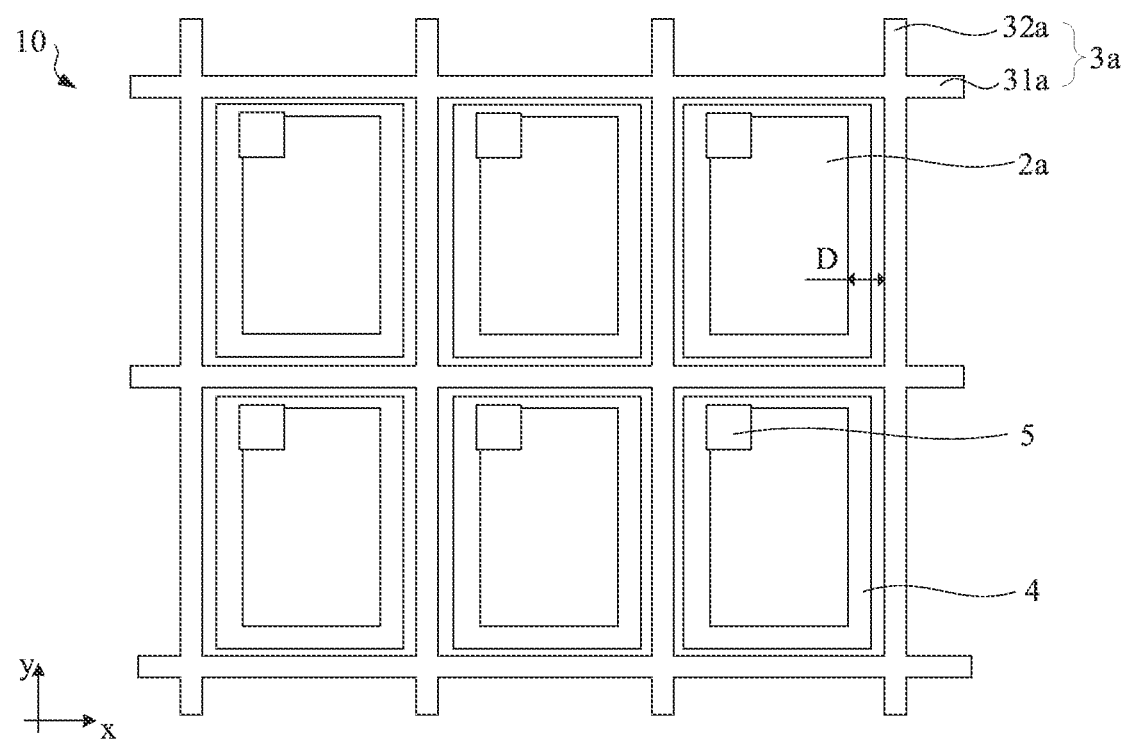
FIG. 4 is a schematic top view of a third structure of the display panel provided by an embodiment of the present application.

Referring to FIG. 4, FIG. 4 is a schematic top view of a third structure of a display panel provided by an embodiment of the present application. The pixel electrode layer 2 is arranged in multiple rows along the first direction x, and the pixel electrode layer 2 is arranged in multiple columns along the second direction y. There are gaps S between the pixel electrode layers 2. The electric field electrode 3a includes a first part 31a and a second part 32a. The first part 31a is arranged between adjacent ones of the rows of pixel electrodes 2a along the first direction x, and the second part 32a is arranged between adjacent ones of the columns of pixel electrodes 2a along the second direction y. The first part 31a is connected to the second part 32a. The first direction x intersects the second direction y. In the present application, the first direction x is a direction extending along an x-axis, and the second direction y is a direction extending along a y-axis. Therefore, in the present application, the first direction x and the second direction y are used for description. In FIG. 3, the first direction x perpendicular to the second direction y is taken as an example for illustration. In fact, the first direction x and the second direction y may be any two directions that intersect each other. In addition, while the pixel electrode layer 2 in FIG. 2 and FIG. 3 is set in an ellipse shape, and the pixel electrode layer 2 in FIG. 4 is set in a rectangle shape, the pixel electrode layer 2 can also be set in other shapes. For example, the pixel electrode layer 2 can be set in a circular shape, a diamond shape, or other shapes that facilitate the arrangement of pixels, which is not particularly limited in the present application.

It should be noted that the electric field electrode 3a is arranged between the rows of pixel electrodes 2a along the first direction x, and is arranged between the columns of pixel electrodes 2a along the second direction y. Then, the electric field electrode 3a can be arranged in a mesh in the gap along the first direction x and the second direction y as shown in FIG. 4.

Figure 5:
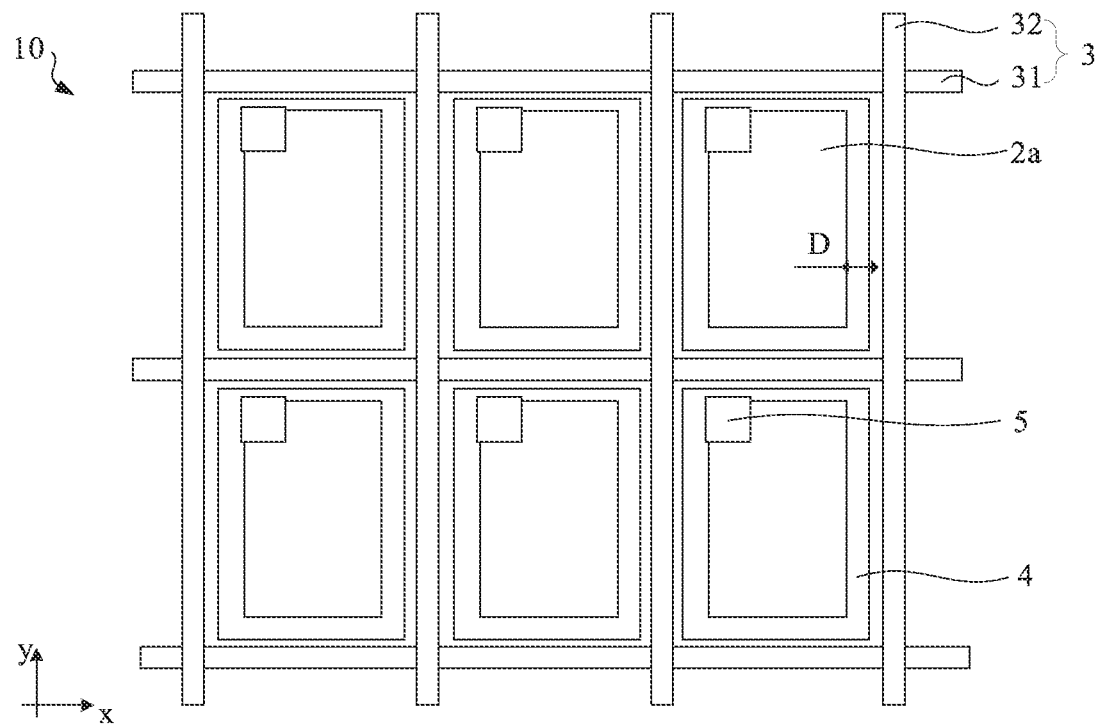
FIG. 5 is a schematic top view of a fourth structure of the display panel provided by an embodiment of the present application.

Referring to FIG. 5. FIG. 5 is a schematic top view of a fourth structure of a display panel provided by an embodiment of the present application. The pixel electrode layer 2 is arranged in multiple rows along the first direction x, and the pixel electrode layer 2 is arranged in multiple columns along the second direction y. There are gaps S between the pixel electrode layers 2. The electric field electrode 3a is arranged between adjacent ones of the rows of pixel electrodes 2a along the first direction x, or arranged between adjacent ones of the columns of pixel electrodes 2a along the second direction y. That is, the electric field electrode 3a may also be arranged in an elongated shape in the gap along one of the first direction x or the second direction y. Alternatively, a part of the electric field electrode 3a is arranged in a certain layer along the first direction x, and another part of the electric field electrode 3a is arranged in another layer along the second direction y. Similarly, the first direction x and the second direction y may be any two directions that intersect each other.

Optionally, the electric field electrode layer 3 is a signal wiring layer. The electric field electrode layer 3 and the gate layer 17 are arranged in the same layer. Alternatively, the electric field electrode layer 3 is arranged in the same layer as the source wiring 20 and the drain wiring 19. That is, the signal wiring layer includes a scan signal wiring 31 and a data signal wiring 32. The electric field electrode layer 3 may be a scan signal wiring 31 or a data signal wiring 32, or the electric field electrode layer 3 may be formed by the scan signal wiring 31 and the data signal wiring 32 surrounding the pixel electrode layer 2.

For example, when the electric field electrode layer 3 is the scan signal wiring 31, the electric field electrode layer 3 may be arranged in the gap S between the pixel electrodes 2a along the first direction x. Voltages are respectively applied to the scan signal wiring 31 and the pixel electrode 2a to form a uniform horizontal electric field with electric field lines along the second direction y between the scan signal wiring 31 and the pixel electrode 2a. The method of forming an electric field between the data signal wiring 32 and the pixel electrode 2a is similar to the above, and will not be repeated herein for brevity.

It is appreciated that when the electric field electrode layer 3 is the scan signal wiring 31 and the data signal wiring 32, the electric field electrode layer 3 may be arranged in a mesh shape in the gap between the pixel electrodes 2a along the first direction x and the second direction y. The electric field formed by the electric field electrode layer 3 and the pixel electrode 2a is a uniform electric field with electric field lines from the electric field electrode layer 3 to the pixel electrode 2a. Alternatively, the electric field formed by the electric field electrode layer 3 and the pixel electrode 2 a is a uniform electric field with electric field lines from the pixel electrode 2a to the electric field electrode layer 3.

In this embodiment, the electric field is formed by the signal wiring in the thin film transistor 5 and the pixel electrode. When printing the light-emitting function layer of a certain sub-pixel, if the surrounding sub-pixel light-emitting function layers have been printed, the electric field between the pixel electrode layer 2 and the electric field electrode layer 3 can be selected for inkjet printing to prevent the thickness of a film formed by the surrounding light-emitting function layer from forming electrical shielding on the pixel electrode layer 2 and impacting the effect of electric field force. This can ensure the printing effect of the sub-pixel light-emitting function layer and make ink deposition more uniform. In addition, the electric field electrode layer 3 may also be other wirings in the display panel 10, such as reset signal wiring, etc., which is not particularly limited in the present application.

Figure 6:
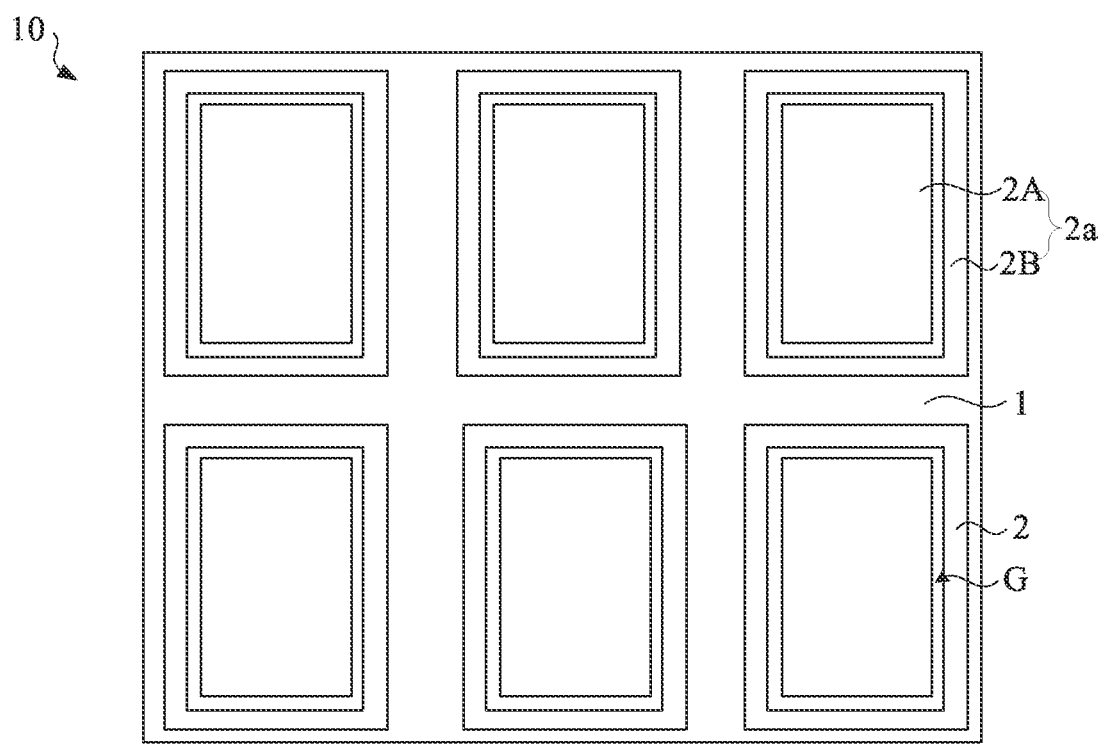
FIG. 6 is a schematic top view of a fifth structure of the display panel provided by an embodiment of the present application.

Referring to FIG. 6, FIG. 6 is a schematic top view of a fifth structure of the display panel provided by an embodiment of the present application. The display panel 10 provided by an embodiment of the present application includes an array substrate 1 and a pixel electrode layer 2. The pixel electrode layer 2 is disposed on the array substrate 1. The pixel electrode layer 2 includes a plurality of pixel electrodes 2a.

The pixel electrode 2a has a first electrode portion 2A and a second electrode portion 2B. The first electrode portion 2A is disposed around at least a portion of the second electrode portion 2B.

A gap G is defined between the first electrode portion 2A and the second electrode portion 2B. The gap G between the first electrode portion 2A and the second electrode portion 2B has the same distance everywhere.

Figure 8:
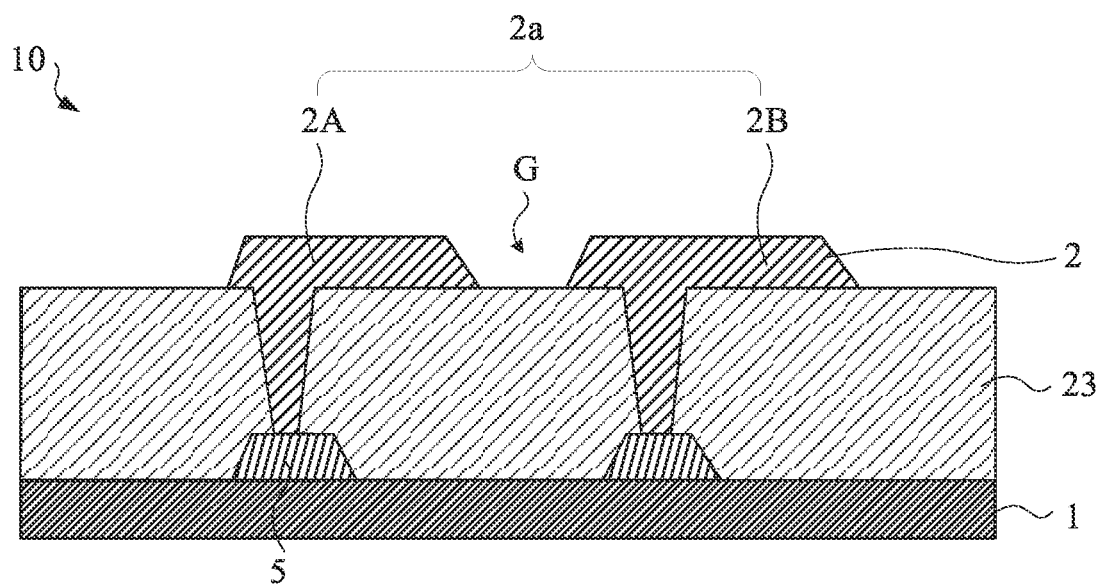
FIG. 8 is a schematic diagram of a third structure of the display panel provided by an embodiment of the present application.

The embodiment shown in FIG. 8 provides a display panel 10 that directly utilizes the first electrode portion 2A and the second electrode portion 2B of the pixel electrode 2a to form an electric field, and there is no need to control voltage values of other electrodes. An electric field is formed in the pixel electrode 2a, and when the electric field assists the deposition of the light-emitting function layer, the generated electric field force is relatively large, which can make the deposition of the light-emitting function layer more uniform. In addition, since the first electrode portion 2A is arranged around the second electrode portion 2B, it is beneficial to improve the uniformity of the electric field generated by the first electrode portion 2A and the second electrode portion 2B.

Figure 7:
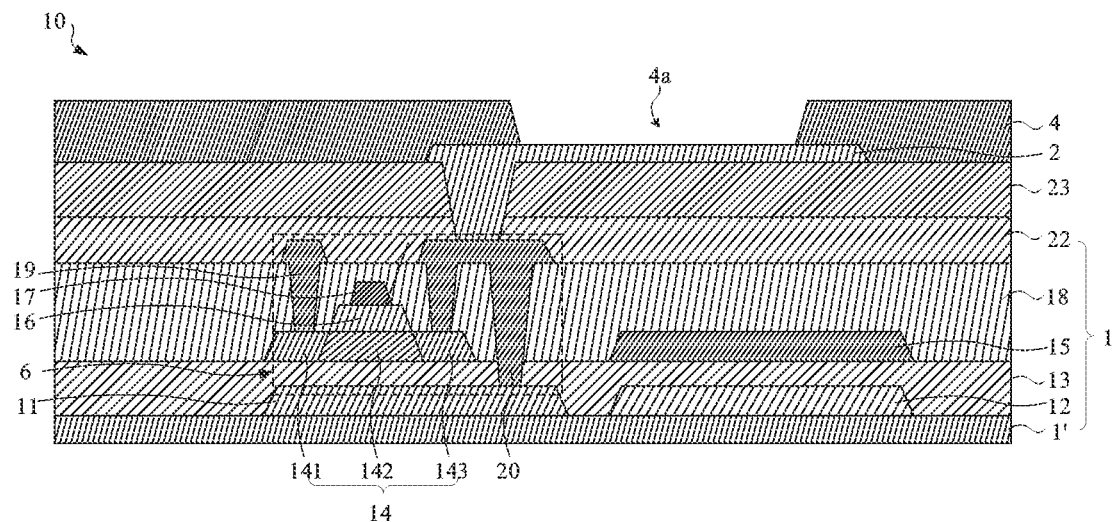
FIG. 7 is a schematic diagram of a second structure of the display panel provided by an embodiment of the present application.

Referring to FIG. 7, FIG. 7 is a schematic diagram of a second structure of the display panel provided by an embodiment of the present application. The display panel 10 further includes a thin film transistor 5 and a planarization layer 23. The pixel electrode layer 2 is disposed on the planarization layer 23 and connected to the thin film transistor 5.

Referring to FIG. 8, FIG. 8 is a schematic diagram of a third structure of the display panel provided by an embodiment of the present application. Each thin film transistor 5 correspondingly controls a voltage of the first electrode portion 2A or the second electrode portion 2B. Each thin film transistor 5 correspondingly controls the voltage of one electrode portion, so that a voltage difference is formed between the first electrode portions 2A or the second electrode portions 2B. Such an arrangement can finely control a potential difference and an electric field in the sub-pixels.

Figure 9:
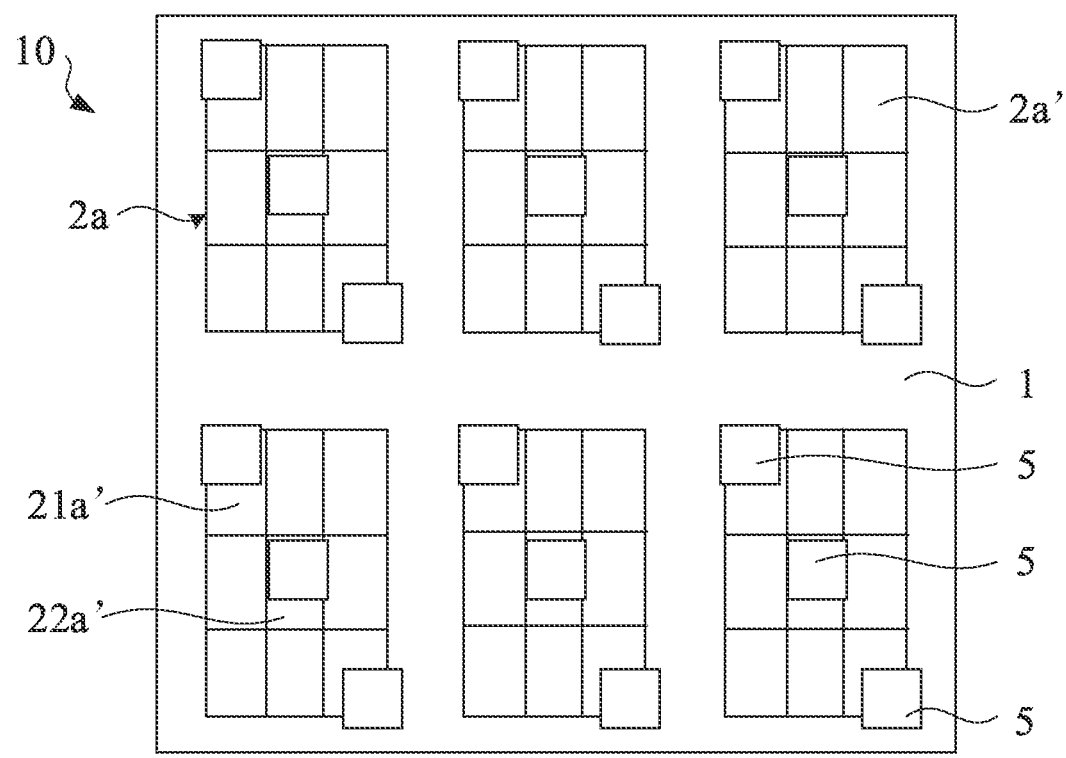
FIG. 9 is a schematic top view of a sixth structure of the display panel provided by an embodiment of the present application.

Referring to FIG. 9. FIG. 9 is a schematic top view of a sixth top view of a display panel provided by an embodiment of the present application. The pixel electrode 2a includes m rows×n columns of sub-pixel electrodes 2a'. There is a gap between adjacent sub-pixel electrodes 2a'. The sub-pixel electrode 2a' includes a plurality of first sub-pixel electrodes 21a' and at least one second sub-pixel electrode 22a'. The first sub-pixel electrode 21a' is disposed around at least a portion of the second sub-pixel electrode 22a'. Regarding m rows×n columns of the sub-pixel electrodes 2a', m and n are positive integers greater than or equal to 3. The sub-pixel electrodes 2a' are insulated from each other, and are only illustrated as divided by black solid lines in FIG. 9.

It should be noted that the pixel electrode 2a is appropriately divided, and a proportion of an area of the divided region in an area of the entire pixel electrode 2a is controllable. Therefore, dividing a pixel electrode 2a into m rows×n columns of sub-pixel electrodes 2a' will not impact the light-emitting effect.

The sub-pixel electrodes 2a' are formed in the pixel electrodes 2a in the row and column directions, and their manufacturing process is simple and does not require a complicated patterning method. Moreover, such an arrangement of the sub-pixel electrodes 2a' is also more convenient for production of the corresponding thin film transistors. In addition, the distance between the sub-pixel electrodes 2a' is relatively close, which can generate a stronger electric field force, thereby improving the electrodeposition effect, shortening a time period required for electric field assisted deposition of the light-emitting functional layer, thus improving the film formation quality.

Each thin film transistor 5 correspondingly controls the voltage of a row of sub-pixel electrodes 2a'. Alternatively, each thin film transistor 5 correspondingly controls the voltage of a column of sub-pixel electrodes 2a'. Alternatively, each thin film transistor 5 correspondingly controls the voltage of one sub-pixel electrode 2a'. In FIG. 9, only two thin film transistors 5 are shown in each sub-pixel area, but the present application is not particularly limited thereto.

Each thin film transistor 5 controls the voltage of a row of sub-pixel electrodes 2a' or correspondingly controls the voltage of a column of sub-pixel electrodes 2a', which can thus form high and low potentials in the sub-pixels. The high and low potentials between the rows and columns cause a voltage difference between the sub-pixel electrode 2a' and the sub-pixel electrode 2a' to further form an electric field. When the thin film transistor 5 controls the voltage of one row or one column of sub-pixel electrodes 2a', the most central row of sub-pixel electrodes 2a' can be used as the second electrode portion 2B, and the surrounding sub-pixel electrodes 2a' can be used as the first electrode portion 2A. The electric field intensity between the sub-pixel electrodes 2a' is relatively large, which can provide sufficient electric field force to assist the printing process of the light-emitting functional layer. In addition, this method requires fewer thin film transistor devices 6, which can reduce difficulty and accuracy of the manufacturing process.

Each thin film transistor device 6 correspondingly controls the voltage of one sub-pixel electrode 2a', so that a voltage difference is formed between the sub-pixel electrodes 2a'. Such an arrangement can finely control the potential difference and the electric field in the sub-pixels. In FIG. 9, taking m equal to 3 and n equal to 3 as an example, the pixel electrode 2a is divided into 3×3, that is nine, sub-pixel electrodes 2a'. In addition, in the sub-pixel electrode 2a' shown in FIG. 7, "a" equal to 1 may be taken as an example, the pixel electrode 2a' at the outermost circle is used to form the first electrode portion 2A, and the sub-pixel electrode 2a' at the center is used to form the second electrode portion 2B.

In this embodiment, the first sub-pixel electrode 21a' is used as the first electrode portion 2A, and the second sub-pixel electrode 22a' is used as the second electrode portion 2B. By dividing the pixel electrode 2a into a plurality of sub-pixel electrodes 2a', and then controlling the voltages of the sub-pixel electrodes 2a' at different positions to form an electric field, it is convenient to control a relative position and a relative area of the first electrode portion 2A and the second electrode portion 2B, and thus more convenient to control a form of the uniform electric field that needs to be formed.

The display panel 10 provided by an embodiment of the present application can generate an electric field on the pixel electrode 2a by controlling the voltage difference between the pixel electrode layer 2 and the electric field electrode layer 3, or controlling the voltage difference generated inside the pixel electrode layer 2. Moreover, since opposite poles of the display panel 10 provided in the present application for generating the electric field are specially designed, a distance between the opposite poles that generate the electric field is constant everywhere. That is, shapes of the opposite poles that generate the electric field are matched with each other, thereby improving uniformity of the electric field. The vertical component of the electric field provides charged groups in a material of a light-emitting functional layer with a force to deposit on the pixel electrode layer 2, which can promote deposition of an ink of a light-emitting functional material on the pixel electrode layer 2 during inkjet printing. Material deposition of light-emitting functional layer assisted by the electric field can suppress the generation of coffee rings, and effectively improve a quality of the light-emitting functional layer, thereby improving performance of the display panel 10.

In addition, the electric field generated in the display panel 10 of the present application can also be applied during drying of the light-emitting function layer material, the charged groups in the light-emitting function layer solution are fixed by the uniform electric field on the pixel electrode layer 2. As such, a solvent is prevented from driving a movement of the charged groups when the solvent is volatilized, thereby obtaining a light-emitting functional layer with a uniform film thickness, avoiding occurrence of coffee ring phenomenon, and obtaining a high-quality film. In addition, by using the electric field in the drying stage to fix the charged groups, the drying process does not require strict pumping control during the solvent volatilization process, thereby greatly simplifying a vacuum drying process and improving the processing efficiency.

In addition, in the display panel 10 provided by the present application, shapes of the two electrodes forming the electric field are designed, and the distance of the gap D or the gap G between the adjacent electrodes is constant everywhere. Thus, the two electrodes can generate a uniform electric field, which optimizes a dispersion path of the movement of the charged groups during electric field assisted deposition or electric field assisted drying, so that the film deposition is more uniform. Further, the display effect and device performance of the display panel 10 can be improved.

It should be noted that the structure of the display panel 10 provided in the present application can also be applied to deposition and drying of other layers. Specifically, it is applicable for a film including solutes composed of one or a combination of inorganic nanoparticles, noble metal nanoparticles, colloidal nanosheets, colloidal nanorods, and nano-films. Further, the nanoparticles can be one or a combination of barium sulfate ($BaSO_4$), calcium carbonate ($CaCO_3$), cesium zinc (ZnSe), cadmium sulfide (CdS), titanium dioxide ($TiO_2$), barium titanate ($BaTiO_3$), zinc sulfide (ZnS), zirconium oxide ($ZrO_2$), silicon nitride ($Si_3N_4$), tin oxide (SnO), and zinc oxide (ZnO).

The solutes in the solution of the light-emitting functional layer in the present application may be a quantum dot material. Specifically, a luminescent core material of the quantum dot material is one or a combination of $ZnCdSe_2$, InP, $Cd_2SSe$, CdSe, $Cd_2SeTe$, and InAs. An inorganic protective shell material of the quantum dot material is one or a combination of CdS, ZnSe, $ZnCdS_2$, ZnS, and ZnO. The quantum dot material may also include a hydrogel loaded quantum dot structure, CdSe—$SiO_2$ quantum dots, and perovskite quantum dots. Surface ligands of the quantum dot material include one or a combination of amines, acids, mercapto alcohols, and organophosphorus. The solvent used in the light-emitting functional layer can be a colorless, transparent, and low-boiling organic or inorganic solvent. For example, the solvent may be one or a combination of deionized water, methanol, ethanol, ethylene glycol, propylene glycol, ethyl acetate, petroleum ether, and n-hexane.

When the quantum dot material is negatively charged, the target pixel electrode 2a on which the quantum dot material is deposited is positively charged. When the quantum dot material is positively charged, the target pixel electrode 2a on which the quantum dot material is deposited is negatively charged. In order to guarantee a best effect of deposition, a timing of voltage application can be selected to be after the light-emitting functional layer solution completely covers the pixel electrode 2a, so that the charged groups in the light-emitting functional layer can be deposited more uniformly and completely cover the pixel electrode 2a under an action of a uniform electric field.

The display panel provided by the embodiments of the present application is described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising:
an array substrate,
a pixel electrode layer disposed on the array substrate and including a plurality of pixel electrodes;
an electric field electrode layer disposed on the array substrate, wherein the electric field electrode layer is insulated from the pixel electrode layer, and the electric field electrode layer includes at least one electric field electrode at least surrounding a part of the pixel electrode,
wherein different voltages are applied to the pixel electrode layer and the electric field electrode layer to form a voltage difference, so that an electric field is formed between the pixel electrode layer and the electric field electrode layer, the electric field has a horizontal component and a vertical component, the vertical component of the electric field provides charged groups in a material of a light-emitting functional layer with a force to deposit on the pixel electrode layer;
wherein the array substrate comprises a light shielding layer, a first capacitor plate, a buffer layer, a semiconductor layer, a second capacitor plate, and a gate insulating layer, a gate layer, an interlayer insulating layer, a drain wiring, a source wiring, an auxiliary cathode wiring, a passivation layer, and a planarization layer which are sequentially stacked on a side of the substrate; and the pixel electrode layer and the electric field electrode layer are disposed on the planarization layer.

2. The display panel according to claim 1, wherein a gap is defined between the electric field electrode and the pixel electrode, and the gap has a constant distance between a portion of the electric field electrode surrounding the pixel electrode and the pixel electrode.

3. The display panel according to claim 1, wherein the electric field electrode is in one-to-one correspondence to the pixel electrode, and the electric field electrode is arranged around the pixel electrode to form a closed pattern.

4. The display panel according to claim 1, wherein the pixel electrode is arranged in a plurality of rows along a first direction, the pixel electrode is arranged in a plurality of columns along a second direction, and the electric field electrode includes a first part and a second part, wherein the first part is arranged between adjacent ones of the rows of the pixel electrode along the first direction, the second part is arranged between adjacent ones of the rows of the pixel electrode along the second direction, the first part is connected to the second part, and the first direction intersects the second direction.

5. The display panel according to claim 1, wherein the pixel electrode is arranged in multiple rows along a first direction, the pixel electrode is arranged in multiple columns along a second direction, and the electric field electrode is arranged between adjacent ones of the columns of the pixel electrode along the first direction, or between adjacent ones of the rows of the pixel electrode along the second direction, and the first direction intersects the second direction.

6. The display panel according to claim 1, wherein a distance of the gap is between 1 μm and 10 μm.

7. The display panel according to claim 1, wherein a distance of the gap is between 2 μm and 5 μm.

8. The display panel according to claim 1, wherein the array substrate further comprises a thin film transistor, and the pixel electrode layer is connected to the thin film transistor.

9. The display panel according to claim 8, wherein the electric field electrode layer is an auxiliary electrode layer, and the electric field electrode layer is disposed in a same layer as the pixel electrode layer.

10. The display panel according to claim 1, wherein the display panel further comprises a pixel definition layer disposed on a side of the pixel electrode layer away from the array substrate, the pixel definition layer is provided with an opening thereon, and the opening is defined corresponding to the pixel electrode.

11. The display panel according to claim 10, wherein a side of the pixel definition layer close to the array substrate is hydrophilic, and a side of the pixel definition layer away from the array substrate is hydrophobic.

12. The display panel according to claim 1, wherein a material of the electric field electrode layer is one or a combination of gold, silver, copper, aluminum, and transparent metal oxide.

* * * * *